United States Patent [19]

Stefani

[11] Patent Number: 5,226,471

[45] Date of Patent: Jul. 13, 1993

[54] LEAK ISOLATING APPARATUS FOR LIQUID COOLED ELECTRONIC UNITS IN A COOLANT CIRCULATION SYSTEM

[75] Inventor: Gary G. Stefani, Endicott, N.Y.

[73] Assignee: General Electric Company, Johnson City, N.Y.

[21] Appl. No.: 763,570

[22] Filed: Sep. 23, 1991

[51] Int. Cl.$^5$ .................... F28F 11/00; F28F 27/02
[52] U.S. Cl. .................... 165/13; 165/70; 165/103; 165/80.4; 165/104.33; 361/385
[58] Field of Search .............. 165/34, 35, 38, 101, 165/103, 70, 80.4, 13, 104.33; 361/385

[56] References Cited

U.S. PATENT DOCUMENTS

| | | | |
|---|---|---|---|
| 2,501,709 | 3/1950 | Booth | 165/38 |
| 2,647,730 | 8/1953 | Teague, Jr. | 165/35 |
| 3,211,375 | 10/1965 | Prokupek et al. | 165/103 |
| 3,227,372 | 1/1966 | Prokupek et al. | 165/103 |
| 4,646,818 | 3/1987 | Ervin, Jr. | 165/103 |
| 4,698,728 | 10/1987 | Tustaniwskyj et al. | 361/385 |
| 4,738,304 | 4/1988 | Chalmers et al. | 165/70 |
| 4,922,999 | 5/1990 | Stokes et al. | 165/70 |
| 5,086,829 | 2/1992 | Asakawa | 361/385 |

FOREIGN PATENT DOCUMENTS

| | | | |
|---|---|---|---|
| 0245083 | 10/1987 | Japan | 165/103 |
| 572889 | 10/1945 | United Kingdom | 165/70 |

*Primary Examiner*—John K. Ford
*Attorney, Agent, or Firm*—Bernard E. Shay; Stephen A. Young

[57] ABSTRACT

The invention relates to leak isolating apparatus for multiple liquid cooled units in a coolant circulation system. The leak sensing portion of the apparatus comprises a supply flow meter and a return flow meter associated with each unit. The flow meters produce two variable electrical outputs proportional to the flow rates, and which are coupled to control logic for operating the isolating valves for the unit. The control logic compares the difference between the electrical outputs of the flow meters, and if the differences exceed a threshold, indicating a leak, operates the isolating valves. In the event of a sensed leak in a system having serially connected units, two serial valves are operated to prevent coolant flow to and from the leaking unit and a bypass valve is generated to allow coolant to flow around the leaking unit thus preserving the flow of coolant to the other units. The system is quick to respond (typically two seconds) and is capable of sensing leaks as small as a slow drip (4 ml per minute).

3 Claims, 2 Drawing Sheets

LEAK ISOLATING APPARATUS FOR LIQUID COOLED ELECTRONIC UNITS IN A COOLANT CIRCULATION SYSTEM

BACKGROUND OF THE INVENTION

1. Field of the Invention

The invention relates to cooling systems in which plural liquid cooled units are part of a single coolant circulation system, and more particularly to means for minimizing damage to the cooled unit in the event of leakage in one.

2. Prior Art

In many complex electronics systems, large amounts of heat are generated in confined spaces. Current systems invariably use solid state active components which generate heat and which cannot operate without such heat being removed. For solid state components, a rise in temperature produces an alteration in performance; destruction, if the temperature rise is too great; and if the temperature rise is sustained, an acceleration of the time between failures. In aviation electronics (i.e. "avionics") the problem is particularly acute, since weight and volume must be conserved, and since there is extreme concern for reliability. The solution for cooling avionics units is increasingly liquid cooling, which allows for denser packaging.

In seeking maximum reliability, the answer is redundancy for such primary functions as flight control and engine control and triple or quadruple redundancy is common. In such systems, three or four flight control computing units operate continuously, all providing simultaneous computations to a common decision logic, which maintains a check on the "health" of the units, and decides which computations to rely on.

With redundant avionics units, all operating, and space and weight being at a premium, cooling of all units is essential, preferably by efficient liquid cooling. In addition, the cooling must be provided in a manner allowing maximum reliability.

The practical solution for cooling multiple avionics units has evolved to a single coolant circulation system having a single circulating pump and refrigeration unit supplying cooled liquid in tubing connected to each of the multiple units. While there are many practical advantages in using a single circulation system, there is a disadvantage in that a leak in one of the units may not only subject the electronics in the leaking unit to damage from overheating, but may drain coolant from the entire system, and place the electronics of all the units at risk.

The potential causes of leakage are multiple and the leaks may be either of a slow nature or catastrophic. Slow leaks may arise from a fitting that has vibrated loose, a crack or failure in the piping or in the ducts carrying the coolant through the avionics unit. A catastrophic failure may result from loss of a turbine bucket in an engine failure, or damage to the aircraft which ruptures a piece of tubing.

A primary concern in protecting against leakage are that the means selected to detect the leak be reliable. Reliability in this context includes having sensitivity to small leaks, being able to discriminate between a leak and other transient affects, and being readily calibrated. One solution that was investigated was to sense the pressure drop across an avionics unit using a mechanical isolation valve, designed to trip when the pressure drop across the unit changed due to a leak. The change in pressure drop produced by a leak of a given size depends upon the pumping rate, pumping pressure, and the impedance of the unit to the flow of coolant. Pressure sensing tended to detect only the larger leaks that would produce a significant change in the pressure drop across the unit. The normal pressure drop, furthermore was not stable under ordinary conditions. As a result the system was very hard to calibrate for discrimination between leaks and other effects causing changes in the pressure drop across the unit. Unsuccessful attempts to eliminate the problems in the pressure measurement approach led to the development of a more reliable method of leak detection.

SUMMARY OF THE INVENTION

Accordingly, it is an object of the invention in a coolant circulation system for multiple units to provide improved means for detecting leakage in one unit and isolating that unit from the other units in the system.

It is a further object in a multiple unit cooling system to provide a reliable means of detecting leaks.

It is another object in a multiple unit cooling system to provide means for detecting small leaks in a unit.

It is still another object in a multiple unit cooling system to provide means providing a fast response to detected leaks.

It is a further object in a multiple unit cooling system to provide leak detection means having a simplified calibration.

These and other objects of the invention are achieved in a coolant circulation system for multiple units requiring liquid cooling by a combination including novel leak isolating apparatus, one associated with each liquid cooled unit.

The apparatus comprises a supply flow meter producing an electrical output proportional to the rate of flow of coolant toward the liquid cooled unit, and a return flow meter of like design responsive to the flow of coolant from the liquid cooled unit.

An electrically operated supply valve is provided connected to the input port of the unit, an electrically operated return valve is provided connected to the output of the unit, and an electrically operated bypass valve connected across a supply line and a return line at the liquid cooled unit.

The apparatus further includes control logic which is electrically connected to supply and return flow meters and which responds to a difference in their electrical outputs and produces a sustained electrical output where that difference exceeds a desired threshold. The output of the control logic is used to operate supply, return and bypass valves. When conditions are normal, flow to and from a circulation unit are maintained and flow in the bypass valve is prevented. When the difference in meter outputs is above the desired threshold value, the control logic operates the valves to prevent flow to and from the circulation unit and to permit flow bypassing the liquid cooled unit which allows the other units to receive coolant.

The system is preferably failsafe with the valves requiring electrical energization only when a leak is present. The control logic preferably contains a differential amplifier connected to an adjustable threshold device. Convenient adjustment of the threshold allows for convenient setting of the leak sensitivity, and it may be set as low as a few ccs per minute, equal to a slow drip.

In the preferred serial arrangement of units, error calibration is facilitated by the fact that the same flow rate is present in all units.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
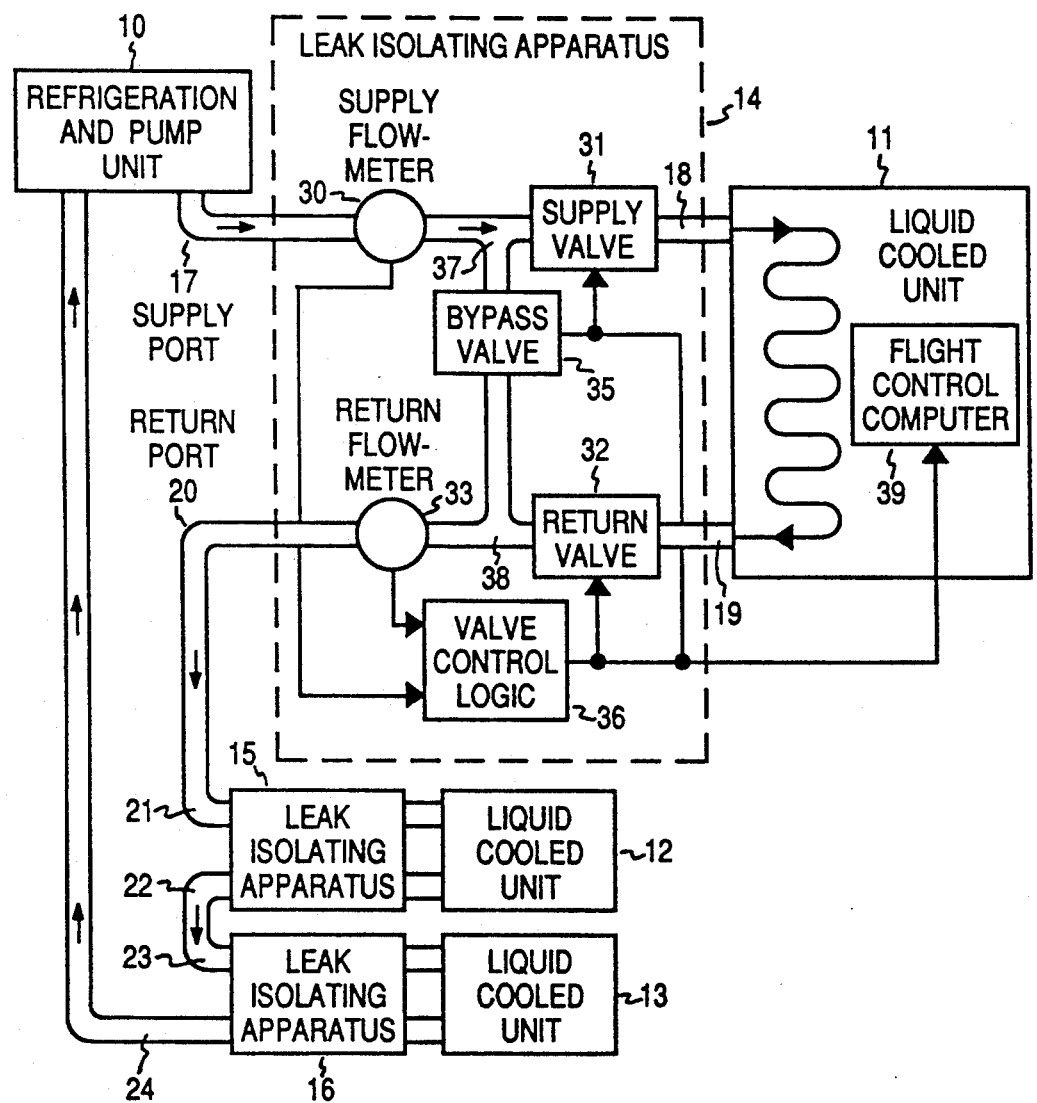
FIG. 1 illustrates a coolant circulation system for series connected liquid cooled units having a novel leak isolating apparatus associated with each unit for sensing leakage in that unit by differential flow measurement and when leakage is sensed, operating valves to minimize leakage in the system and maintain circulation to the other units.

A coolant circulation system incorporating a novel leak isolating apparatus in accordance with a first embodiment of the invention is illustrated in FIG. 1. In the illustrated system, a refrigeration unit and pump 10 circulates cooled liquid to three serially connected liquid cooled units 11, 12, and 13. These units generate heat when they are operated, and require cooling to remove that heat. In a practical embodiment, the liquid cooled units are triple redundant airborne computers operating in parallel. These units operate in confined space (typically 1000–2000 cubic inches), generate substantial quantities of heat (typically 100 to 150 watts per unit), and require cooling to prevent overheating. Overheating of the electronic parts may either cause damage or reduce reliability. Liquid cooling normally facilitates a more compact arrangement than air cooling, and in the present application is the chosen mode of cooling.

The illustrated circulation system, in which three serially connected liquid cooled units 11, 12, 13 are cooled by the refrigeration and pump unit 10 is required to meet high standards of reliability consistent with the high demand for reliability in a flight control system. Reliability in the computation is achieved by triple redundance, each unit being an independent flight control computer, independently performing the flight control computations, and supplying these computations to decision logic, which allows continued reliable computation even if one of the three computers fails. The cooling must be accomplished in a manner which reduces the risk of failure of the flight control system. A major hazard to the cooling system is leakage of the coolant from one of the circulation units due either to a projectile strike in combat or a failure of a fluid connection within the unit. Leakage would normally draw coolant away from the other units, impair their cooling and could cause damage to the electronics wherever cooling was impaired.

Figure 3:
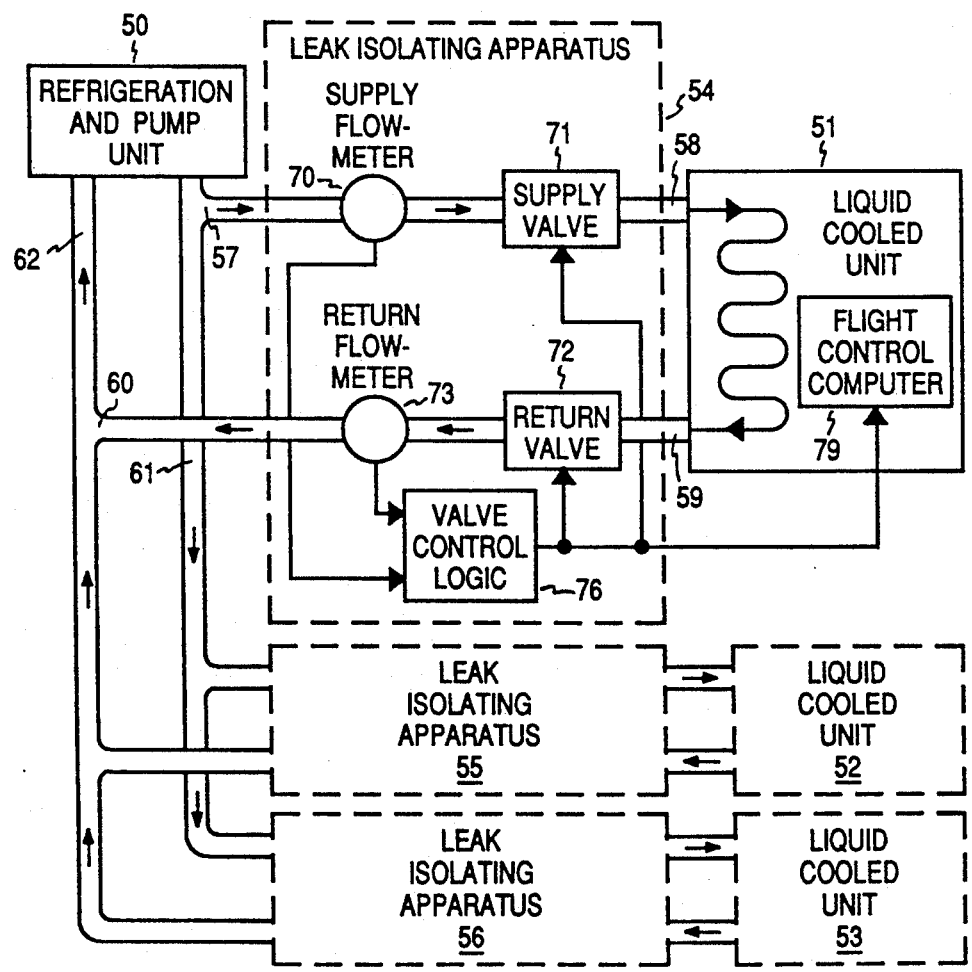
FIG. 3 illustrates a coolant circulation system for parallel connected liquid cooled units having a novel leak isolating apparatus associated with each unit for sensing leakage in that unit by diffferential flow measurement and when leakage is sensed operating valves to minimize leakage in the system and maintain circulation to the other units.

The present invention is designed to mitigate leakage by isolating the leaking unit and allowing the rest of the cooling system to continue to operate. While the novel leak isolating apparatus of FIG. 1 is shown in application to serially connected liquid cooled units, the invention is also applicable to parallel connected liquid cooled units as illustrated in FIG. 3.

In a serial system, the coolant flows successively through the fluid cooled units (11, 12, 13). Each unit has an input port and an output port and is provided with internal passages for circulating the coolant through the unit before it exits through the output port. The passages are arranged in good thermal contact with the heat generating electronics and are largely serial and serpentine. The use of plural passages increases the area of contact between the coolant and the walls of the passages for efficient and even temperature control. In flowing through the circulatory passages within the unit, the coolant absorbs heat generated in a unit. As the heated coolant exits the output port of one liquid cooled unit, it withdraws heat absorbed by the coolant, and enters the input port of the next circulation unit where the process is repeated.

In accordance with the invention, a separate leak isolating apparatus (14, 15, 16) is provided, one for each liquid cooled unit (11, 12, 13). Returning to FIG. 1, the cooled refrigerant enters the first supply port 17, passing through the first leak isolating apparatus 14, to the input port 18 of the first unit 11, traverses the unit, and then returns from the unit's output port 19 through the isolating apparatus 14 to the return port 20. The port 20 is connected to the supply port 2 associated with the second liquid cooled unit 12. A second leak isolating apparatus 15 is provided connected between the port 21 and the second liquid cooled unit 12, and the return paths, as before, lead through the apparatus 15 and through the liquid cooled unit 12 to the return port 22. The port 22 is connected to the third supply port 23 for the third liquid cooled unit 13. As before, a third leak isolating apparatus 16 is provided connected to the port 23, and the return paths lead through the apparatus 16 and through the liquid cooled unit 13 to the return port 24, which is connected to return heated coolant to the refrigeration/pump unit 10.

The leak isolating apparatus 14, whose principal parts are shown in FIG. 1, includes a supply flow meter 30, a supply valve 31, a return valve 32, a return flow meter 33, a bypass valve 35, and valve control logic 36. The leak isolating apparatus 14 responds to the flow meters 30, 33 to operate the three valves 31, 32 and 35 to isolate the cooling system and place the unit 11 in a low dissipation standby condition should leakage be sensed in the liquid cooled unit 11.

Coolant supplied to the first liquid cooled unit 11 enters the leak isolating apparatus 14, flowing directly to the supply flow meter 30. The meter 30 senses the rate of flow of the coolant to the first unit 11, and produces a voltage proportional to the rate of flow. The coolant continues from the flow meter 30 via a line branched at 37 to the supply valve 31.

The supply valve 31, which is electrically operated, is connected between branch 37 and the supply port 18 of the unit 11. When the supply valve 31 is unenergized, flow to the unit is permitted and when it is energized flow to the unit is prevented. Assuming leakage has not been sensed and conditions are normal, the supply valve 31 remains open, allowing coolant to enter the supply port 18 of the unit 11.

The return valve 32 of the apparatus 14 is connected between the return port 19 of the unit and a return line branched at 38. The return valve 32 is also electrically operated. When the return valve is unenergized, flow from the unit 11 is permitted, and when it is energized, flow between the return branch 38 and the unit is prevented.

The supply valves 31 and 32 may be identical, and are coaxial solenoid valves. Electrical operation requires 18-30 volts DC with a maximum power consumption of 12 watts.

Assuming normal conditions, where leakage has not been sensed, the return valve 32 remains open, allowing coolant to pass into the return line branched at 38 and to enter the return flow meter 33. The return flow meter 33 is connected in the path between the return branch 38 and the return port 20. The return flow meter senses the rate of flow of coolant out of the unit 11 and produces a voltage proportional to the rate of flow.

The path of coolant entering port 17, which includes passing through elements 30 and 31 of the leak isolating apparatus 14, passing through the first liquid cooled unit 11, and returning through elements 32 and 33 of the leak isolating apparatus and then entering the port 20 completes the normal path for coolant associated with the first unit.

The flow meters 30 and 33 may be identical and are turbine meters of appropriate size, with a 0 to 5 volts linear output. The meters require a 10-35 V DC supply voltage.

The bypass valve 35 is connected between the supply line at the branch 37 and the return line at the branch 38. The bypass valve 35 is electrically operated and prevents flow in an electrically unenergized state and permits flow in an energized state. Except for an inversion in state with respect to energization, the bypass valve 35 may be of a similar design to the supply and return valves 31 and 32.

The leak isolating apparatus 14 is completed by the valve control logic 36, which has two inputs coupled respectively to the supply flow meter 30 and to the return flow meter 33 and a single output connected to several elements. As illustrated in FIG. 1, the output of the control logic is connected to the supply 31, return 32 and bypass 35 valves and to the liquid cooled unit, where it places the computer in a low dissipation, standby condition.

The valve control logic performs the functions of detecting a leak in the liquid cooled unit and initiating a response by the controlled valves to maintain cooling in the other units of the circulatory system. Assuming that the other units are connected in series as illustrated in FIG. 1, the desired response to leakage in one unit (e.g. 11) is to shut off the supply and return valves associated with that unit (e.g. 31 and 32) and to open the bypass valve associated with that unit (e.g. 35). The energizing of the supply and return valves prevents further exchange of liquid between the leaking unit and other parts of the system, and thus limits the loss of fluid in the remainder of the system. In a series connected system, shutting valves (e.g. 31 and 32) associated with one unit would shut down the circulation in the whole system, were it not for the bypass valve (e.g. 35) associated with that unit which is opened to allow circulation to continue around the leaking unit.

Figure 2:
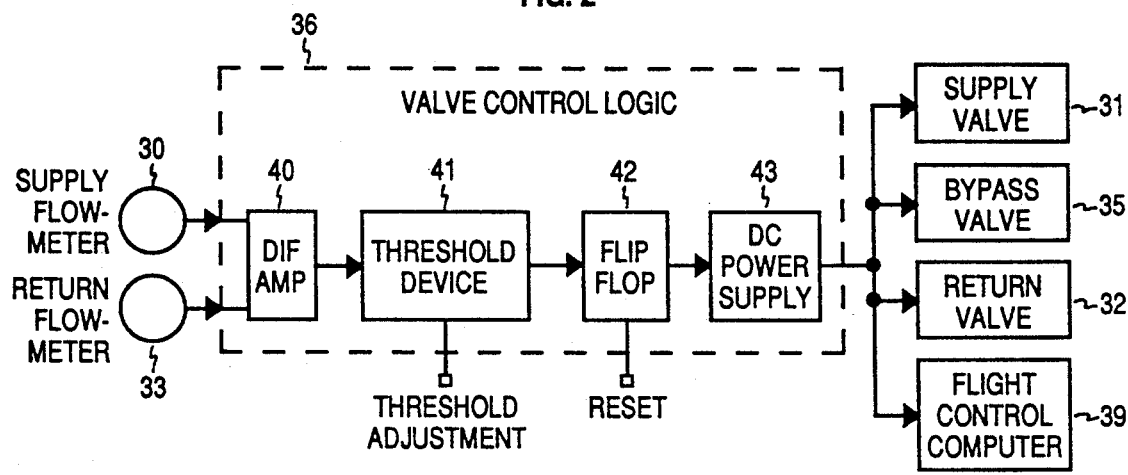
FIG. 2 illustrates the principal blocks making up the valve control logic of the leak isolating apparatus and the principal electrical connections to flow sensing meters and electrically operated valves in performing leak isolation.

The valve control logic 36, whose block diagram and external connections are illustrated in FIG. 2, contains a differential amplifier 40, an adjustable threshold 41, a flip-flop 42, and a logically controlled DC power supply 43. The 0-5 volts DC outputs of the flow meters 30 and 33 are connected to the two inputs of the differential amplifier 40. The differential amplifier 40 responds to these inputs to produce an output proportional to their difference (irrespective of which input is larger). The output of the differential amplifier is then connected to the adjustable threshold 41 which senses when the two flow rates are unequal by a predetermined amount. In the present embodiment, the arrangement is set to respond to a leakage rate of 18 mls per minute, a rate which corresponds to a slow drip. The threshold setting is conveniently adjusted by a potentiometer or other conventional means resident in the electronic circuitry. When the threshold is exceeded, the flip-flop 42 is switched to a high state turning on the logically controlled DC power supply 43. The supply 43 is connected in parallel to all three valves and thus all three valves are energized simultaneously. At a later time, they are also deenergized simultaneously when the problem is cured and the control logic reset. Energization closes the supply and return valves 31 and 32 to prevent further leakage of coolant from the system and opens the bypass valve 35 to allow coolant to proceed through the other units in the circulatory system.

In a practical design of a serial embodiment, the coolant passages are approximately 0.16" in diameter (¼" OD), with external connections being made in ¼" OD aluminum tubing. The coolant supply design pressure is 30 psi, with pumping set at a rate of ⅓ liters per minute. A "chassis", which is a practical form of the liquid cooled unit in FIG. 1 is approximately 16" wide by 10" deep by 8" high and accommodates 20 modules. The "modules" are printed circuit boards formed on heat sinking substrates in good thermal contact at each end with the chassis walls. The walls of the chassis contain passages for circulation of the coolant. In the example, a dissipation of approximately 133 watts is accommodated with the coolant being supplied at 6° C. and experiencing a temperature rise of 16° C. in passage through the unit for an output temperature of 22° C.

The leak isolating apparatus, which depends on sensing a difference in the flow rates in the flow rate meters 30, 33 is sensitive to leaks as small as 18 ml per minute corresponding to a slow drip. The response time is about 2 seconds for both small and large leaks, the latter corresponding to the severing of a coolant line. Response time is defined as $t_r = t_2 - t_1$, where $t_1$ is the instant at which the leak starts, and $t_2$ is the instant at which isolation is complete, complete isolation meaning that supply valve 3 and return valve 32 have been shut and bypass valve 35 has been opened.

In another experimental example, tests were conducted in a pumping system providing a supply pressure of 60 pounds per square inch and a flow rate of 2.9 liters per minute. In these tests, the leak rates were adjusted between 18 and 1243 milliliters per minute to determine the effect upon response time and the amount of fluid lost. In each case, the response time was found to be equal to 2 seconds with an accuracy of ±5%. The fluid lost was approximately proportional to the leak rate, reaching a maximum of 4 milliliters. The experimental example represents a more severe test of the sensitivity of the system than the more realistic earlier example.

FIG. 3 illustrates a second coolant circulation system incorporating a novel leak isolating apparatus in accordance with a second embodiment of the invention. In the second circulation system, the liquid cooled units are connected in parallel. The serially connected system has a principal advantage over the parallel connected system in that an equal rate of flow is established in all of the serially connected units, even when their impedances are unequal. The parallel connected units, assuming equal pressures between the supply and return, and unequal impedances to the flow of the coolant in the individual units usually requires additional flow equalizing measures to insure that the high impedance units get adequate rates of flow of coolant. One advantage of the parallel connected arrangement is that a bypass valve associated with each liquid cooled unit is unnecessary.

As shown in FIG. 3, the refrigeration and pump unit 50 supplies coolant to a supply main 61 and receives spent coolant from the return main 62. Each set comprising a leak isolating apparatus and a liquid cooled unit (e.g. 54, 51; 55, 52; 56. 53) is connected between the mains 61 and 62. In particular, the leak isolating apparatus 54 and the liquid cooled unit 51 are connected at the port 57 formed by a branch in the supply main 61 and the port 60 formed by a branch in the return main 62. The other sets 52, 55 and 53, 56 are similarly connected to corresponding ports formed at branches in the supply and return mains 61, 62.

The leak isolating apparatus 54 in the second embodiment contains a supply flow meter 70 and a supply valve 71 serially connected between the port 57 at supply main and the input port 58 of the liquid cooled unit 51. Similarly, the return valve 72 and the return flow meter 73 are connected in the order recited between the output port of the unit 51 and the port 60 at the return main 62.

As in the serial arrangement, the valve logic 76 responds to a difference in flow rates between the supply and return flow meters. When a difference is sensed, indicative of a leak in the unit, the valve logic operates the supply and return valves 71, 72 to prevent further passage of coolant to either port of the unit. In addition, the valve logic may respond by placing the flight control computer in a low dissipation standby condition.

In the parallel system, the bypass valve is unnecessary, and operation of the valves 71 and 72 to preclude further exchange of coolant with the leaking unit, minimizes leakage of coolant from the cooling system and allows the remainder of the cooling system to continue to operate.

Solenoid valves which meet a temperature requirement of from −55° C. to 125° C. and are miniaturized for aerospace applications should be used in the disclosed embodiments for aircraft use. The flow meters should also be suitable for use in the aerospace environment, be functional over the same temperature range, be light in weight, and suitable for use at reduced atmospheric pressures.

The foregoing system, which uses differential flow measurement to detect leaks, is effective in the face of changes in pressure and generally requires no calibration except to set the sensitivity to small leaks consistent with accuracy of the flow meters. As illustrated, the disclosed arrangement is adaptable to parallel or series arrangements of the cooled units. In addition, in the event of an electrical failure the unenergized valves allow the desired normal flow to the cooled unit, providing a "fail-safe" design.

What is claimed is:

1. In a coolant circulation system, the combination comprising:

A) a source having a supply port for supplying liquid coolant and a return port for accepting liquid coolant, B) at least two units containing heat liberating electronics and requiring liquid cooling, each unit having input and output ports connected by an internal path for circulating liquid coolant within the unit, C) at least two four port leak isolating apparatuses, one for each unit, the first port of the first apparatus being connected to said supply port, each apparatus comprising:

1) a supply liquid flow meter connected to the first port of said first apparatus producing an electrical output proportional to the rate of flow, forming a conduit for liquid coolant flowing from the supply port of said source to a supply branch internal to said apparatus, 2) an electrically operated supply valve connected between said supply branch and a second of said apparatus ports, the latter connected to the input port of the associated unit for selectively permitting flow of coolant in the absence of leakage and preventing flow when leakage is present, 3) an electrically operated return valve connected between a third of said apparatus ports, the latter connected to the output port of the associated unit; and a return branch internal to said apparatus for selectively permitting flow in the absence of leakage and preventing flow when leakage is present, 4) a return liquid flow meter producing an electrical output proportional to the rate of flow, forming a conduit for coolant flowing between said return branch and the fourth of said apparatus ports, 5) an electrically operated bypass valve connected between said supply branch and said return branch, preventing flow in the absence of leakage and permitting flow when leakage is present, and the first, second and any additional apparatuses being serially connected, with the fourth port of said first apparatus being connected to the first port of said second apparatus, and the fourth port of the second apparatus being connected to the first port of any succeeding apparatus, if any, the fourth port of the last apparatus being connected to the return port of the source, and 6) logic means electrically connected to said supply and return liquid flow meters for response to a difference in their electrical outputs, and producing a sustained electrical output for operating said supply, return and bypass valves to maintain flow to and from said first unit and to prevent flow bypassing said unit when said difference is below a desired value, and when said difference is above said desired value operating said valves to prevent flow to and from said first unit and to permit flow bypassing said unit.

2. The combination set forth in claim 1, wherein said supply, return and bypass valves of each apparatus maintain flow to and from the associated unit and prevent flow bypassing the unit in an unenergized state to insure operation of the circulation system in the event of failure of said energization.

3. The combination set forth in claim 1, wherein said logic means comprises a differential amplifier to obtain a signal proportional to the difference in electrical outputs of said flow meters, an adjustable threshold device, producing a binary change in output when said threshold is exceeded and a power source controlled in response to the binary state of said threshold for operating said valves, adjustment of said threshold level providing adjustment of the leak detection sensitivity.

* * * * *